US 9,111,639 B2

(12) United States Patent
Hong et al.

(10) Patent No.: US 9,111,639 B2
(45) Date of Patent: Aug. 18, 2015

(54) BIASING SPLIT GATE MEMORY CELL DURING POWER-OFF MODE

(71) Applicants: Cheong Min Hong, Austin, TX (US); Horacio P. Gasquet, Austin, TX (US); Ronald J. Syzdek, Austin, TX (US)

(72) Inventors: Cheong Min Hong, Austin, TX (US); Horacio P. Gasquet, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 171 days.

(21) Appl. No.: 13/874,127

(22) Filed: Apr. 30, 2013

(65) Prior Publication Data

US 2014/0321213 A1    Oct. 30, 2014

(51) Int. Cl.

| | |
|---|---|
| *G11C 11/56* | (2006.01) |
| *G11C 7/12* | (2006.01) |
| *G11C 16/30* | (2006.01) |
| *G11C 7/04* | (2006.01) |
| *G11C 16/08* | (2006.01) |
| *G11C 16/34* | (2006.01) |
| *G11C 16/22* | (2006.01) |

(52) U.S. Cl.
CPC .............. *G11C 11/5621* (2013.01); *G11C 7/04* (2013.01); *G11C 7/12* (2013.01); *G11C 16/08* (2013.01); *G11C 16/22* (2013.01); *G11C 16/30* (2013.01); *G11C 16/3418* (2013.01); *G11C 16/3495* (2013.01)

(58) Field of Classification Search
CPC ........... G11C 16/0408; G11C 16/0433; G11C 11/5621; G11C 7/12; G11C 7/04; G11C 16/30; G11C 16/22; G11C 16/3495; G11C 16/08; G11C 16/3418
USPC ............. 365/185.05, 185.14, 185.18, 185.23, 365/154; 257/316
See application file for complete search history.

(56) References Cited

U.S. PATENT DOCUMENTS

| | | | |
|---|---|---|---|
| 5,966,332 A * | 10/1999 | Takano .................... | 365/185.29 |
| 5,969,995 A | 10/1999 | Morishima | |
| 7,425,741 B1 | 9/2008 | Strachan et al. | |
| 8,320,191 B2 * | 11/2012 | Strenz et al. ............. | 365/185.27 |
| 2006/0098474 A1 * | 5/2006 | Dang et al. ..................... | 365/154 |
| 2007/0223282 A1 * | 9/2007 | Sarig ........................ | 365/185.23 |
| 2011/0249501 A1 | 10/2011 | Chiavarone et al. | |
| 2012/0175696 A1 * | 7/2012 | Franzon et al. ................ | 257/316 |
| 2014/0126292 A1 * | 5/2014 | Yang et al. ............... | 365/185.18 |

OTHER PUBLICATIONS

U.S. Appl. No. 13/451,876, Winstead et al., "Methods and Systems for Erasing Biasing of Split-Gate Non-Volatile Memory Cells", filed Apr. 20, 2012.
Extended European Search Report and Written Opinion mailed Jun. 17, 2014 for corresponding EP Application No. 14165574, 8 pages.

* cited by examiner

*Primary Examiner* — Richard Elms
*Assistant Examiner* — Ajay Ojha

(57) ABSTRACT

A non-volatile memory (NVM) system has a normal mode, a standby mode and an off mode that uses less power than the standby mode. The NVM system includes an NVM array that includes NVM cells and NVM peripheral circuitry. Each NVM cell includes a control gate. A controller is coupled to the NVM array, applies a voltage to the control gates and power to the peripheral circuitry during the standby mode, and applies an off-mode voltage to the control gates and removes power from the NVM peripheral circuitry during the off mode.

19 Claims, 3 Drawing Sheets

|  | CG | WL | BL | SRC |
|---|---|---|---|---|
| FP | 1.5V | 0 | 0 | 0 |
| STDBY | VDD | VSS | VSS | VSS |
| POWER OFF | VDD_C | VSS | VSS | VSS |
| PGM | 9 | 1V | ILD | 5V |
| ERS | 14 | 0 | 0 | 0 |
| RD | 1.5V | 1.2V | 0.6V | 0V |

FIG. 4

BIASING SPLIT GATE MEMORY CELL DURING POWER-OFF MODE

BACKGROUND

1. Field

This disclosure relates generally to non-volatile memories, and more specifically, to split gate memory cells.

2. Related Art

Split gate non-volatile memories (NVMs) including, for example, split gate flash devices, provide advantages such as low power and space requirements, over stacked-gated devices. Split gate thin film storage memory cells include a layer of discrete charge storage elements embedded between dielectric layers. Charge is stored in the discrete storage elements (also referred to as nanocrystals) when the memory cell is programmed. In some environments such as automobile engines, the memory devices may be subject to high temperature and high endurance requirements. The harsh environments may impact the memory cells' ability to retain data as charge in the storage elements leaks into the well. When the memory device is unpowered, electrons leak into the well through an oxide between the storage elements and the well. Leakage is proportional to cycling and temperature, and inversely proportional to the thickness of the dielectric layer between the storage elements and the well.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 shows an example of different levels of voltage that may be used in the memory system of FIG. 1 during different modes.

DETAILED DESCRIPTION

Embodiments of devices and methods are disclosed for non-volatile memory that maintains a positive bias on control gates of memory cells even when the memory devices are unpowered or disabled. Maintaining a bias voltage on the control gate establishes an electric field that counters the electron leakage through the bottom dielectric layer of the memory cell, thus improving data retention in the memory cells even in high temperature and extended life cycle operation.

Figure 1:
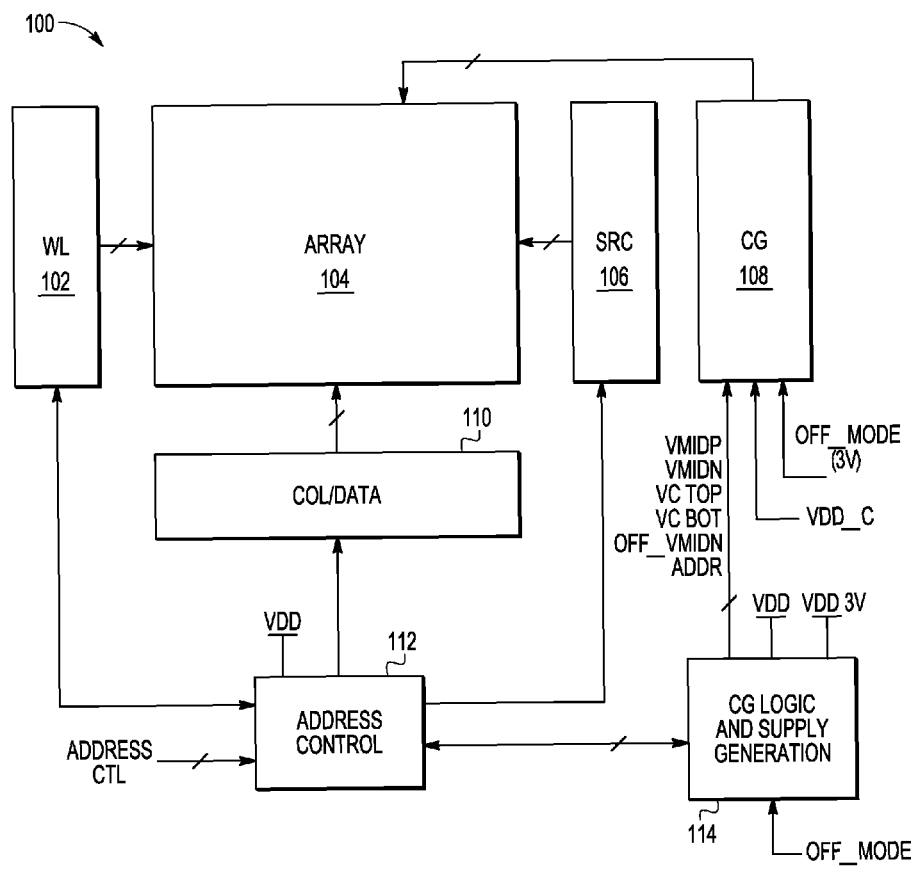
FIG. 1 illustrates, in block diagram form, a memory system having a memory array in accordance with one embodiment of the present disclosure.

FIG. 1 illustrates, in block diagram form, a memory device 100 in accordance with one embodiment of the present disclosure. Memory system 100 includes a split gate memory cell array 104 which includes a plurality of non-volatile memory cells. Array 104 may be partitioned into any number of sectors that are independently addressable. Memory device 100 also includes word line circuitry 102, source circuitry 106, control gate driver circuitry 108, column/data circuitry 110, address control circuitry 112, and control gate logic and supply generation circuitry 114. Word line circuitry 102, source circuitry 106, control gate driver circuitry 108, column/data circuitry 110, address control circuitry 112, and control gate logic and supply generation circuitry 114 can be referred to collectively as "NVM peripheral circuitry". Address control circuitry 112 and control gate logic and supply generation circuitry 114 can be collectively referred to as "a controller".

Word line circuitry 102 has multiple lines coupled to respective word lines of array 104. Source circuitry 106 has multiple lines coupled to source electrodes of respective memory cells in array 104. Control gate driver circuitry 108 has multiple lines to respective control gates of memory cells in array 104.

Array 104 includes any number of bit lines, and each of the bit lines is coupled to column/data circuitry 110 which may include the appropriate sensing and writing circuitry to read/write to the memory cells of array 104. Each sector of array 104 includes any number of word lines. A memory cell is coupled to the intersection of a respective word line and bit line. Note that each word line may be referred to as a row and each bit line as a column of array 104. As will be described in further detail below, word line circuitry 102 provides the appropriate voltage values to each of the word lines, in which the word lines are coupled to select gates of each memory cell.

Address control circuitry 112 receives a number of address control signals corresponding to each sector in array 104. The address control signals may be supplied by a system-on-chip controller or other device that interfaces memory device 100 with one or more processing cores (not shown). Address control circuitry 112 communicates with word line circuitry 102, column/data circuitry 110, source circuitry 106, and control gate logic and supply generation circuitry 114 as needed to read from and write to array 104. Source circuitry 106 and control gate driver circuitry 108 also provide the appropriate voltage values for the source terminals and control gates of each memory cell of array 104. Each memory cell within a sector receives the same control gate voltage and the same source terminal voltage. That is, within each sector, the control gate voltage is a common voltage node and the source terminal voltage is a common voltage node.

Normal modes of operation of memory device 100 can include program, program verify, read, erase, and erase verify. Memory device 100 can also be placed in an unpowered or off mode in which operating power VDD and VDD3V is shut off to memory device 100, however, constant supply voltage VDD_C remains available to control gate driver circuitry 108. In standby mode, operating power VDD and VDD3V are supplied to memory device 100 but memory operations such as read and program are not performed.

Control gate logic and supply generation circuitry 114 receives multiple sector address signals from address control circuitry 112 and outputs supply voltages at various levels such as VDD, VDD3V, VMIDP, VMIDN, VCGTOP, VCGBOT, and OFF_VMIDN, and pre-decoded address signals to control gate driver circuitry 108. Control gate driver circuitry 108 also receives an OFF_MODE voltage and a constant supply voltage VDD_C that is supplied by an external power supply terminal (not shown) that may be part of a system on a chip or other processing system that includes memory device 100. The OFF_MODE voltage indicates a power-off mode of device 100. The constant supply voltage VDD_C is used when the OFF_MODE voltage indicates power is off to bias the control gates of memory cells in array 104. The bias voltage helps establish an electric field that prevents storage elements in the cells from leaking current into the well or channel of the memory cells.

Figure 2:
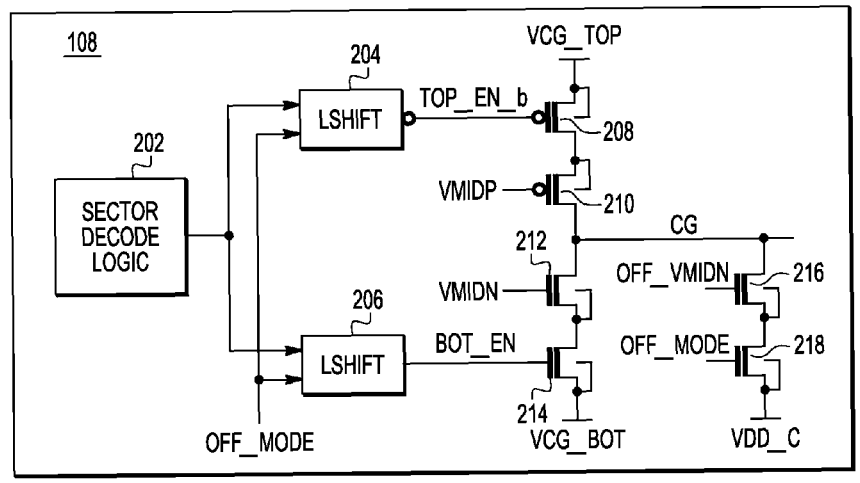
FIG. 2 illustrates, in schematic form, a portion of the memory array of FIG. 1 in further detail, in accordance with one embodiment of the present disclosure.

FIG. 2 illustrates, in schematic form, an embodiment of a portion of control gate driver circuitry 108 of FIG. 1 in further detail including sector decode logic 202, level shifters 204, 206, P-channel transistors 208, 210, and N-channel transistors 212, 214, 216 and 218. Any number of control gate driver circuitry 108 can be included in memory device 100 with each control gate driver circuitry 108 being provided for a corresponding sector of array 104 (FIG. 1).

Sector decode logic 202 provides any number of decoded sector address signals to level shifter circuits 204, 206. Level shifters 204, 206 receive decoded sector address signals from sector decode logic 202 as well as the OFF_MODE voltage. During powered operation, level shifter 204 converts the sector address signals to voltage suitable for use to select one or more sectors and level shifter 206 converts the second address signals to voltage suitable for deselecting one or more sectors. During unpowered operations, level shifters 204, 206 cease operation and output inactive voltages to their respective PMOS and NMOS devices. The output of level shifter 204 shown as TOP_EN_b voltage is inverted and provided to a control gate of P-channel transistor 208. The output of level shifter 206 shown as BOT_EN voltage is provided to a control gate of N-channel transistor 214.

P-channel transistor 208 has a source terminal coupled to a top supply voltage level (VCG_TOP) and a drain terminal coupled to a source terminal of P-channel transistor 210. A control terminal of P-channel transistor 210 is coupled to middle-p supply voltage VMIDP.

N-channel transistor 212 has a drain terminal coupled to the drain terminal of P-channel transistor 210. A control terminal of N-channel transistor 212 is coupled to a middle-n supply voltage VMIDN. N-channel transistor 214 has a drain terminal coupled to a source terminal of transistor 212 and a source terminal coupled a bottom supply voltage level (VCG_BOT).

A control gate voltage CG is taken at a node between the drain terminal of P-channel transistor 210 and the drain terminal of N-channel transistor 212.

N-channel transistor 216 has a drain terminal coupled to the control gate voltage CG, a control gate coupled to an OFF_VMIDN voltage, and a source terminal coupled to a drain terminal of N-channel transistor 218. N-channel transistor 218 further has control gate coupled to the OFF_MODE voltage and a source terminal coupled to constant supply voltage VDD_C. N-channel transistors 216, 218 can be referred to as an off-mode supply circuit.

P-channel transistor 210 limits the bias seen at drain of P-channel transistor 208. N-channel transistor 212 limits the bias seen at drain of N-channel transistor 214.

When power is not supplied to the memory device 100 (FIG. 1), the sector decode logic circuit 202 has no output, so the OFF_MODE signal is used in LSHIFT circuit 204 to hold TOP_EN_b voltage high to place P-channel transistor 208 in non-conducting mode. Similarly the OFF_MODE signal is used in LShift circuit 206 to hold the BOT_EN voltage low to place N-channel transistor 214 in non-conducting mode. The OFF_MODE and OFF_VMIDN voltages are set high to place N-channel transistors 216, 218 in conducting mode so that the control gate voltage CG has the level of the constant supply voltage VDD_C.

Figure 3:
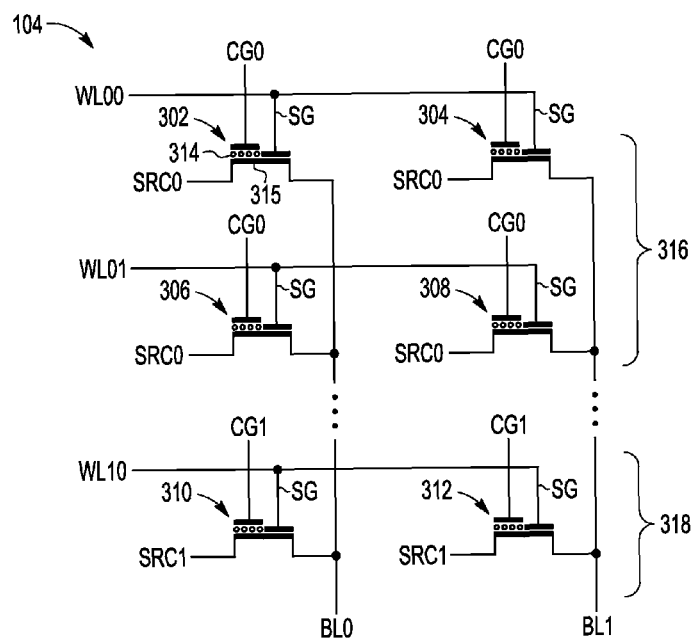
FIG. 3 illustrates a cross-sectional view of a split gate device of a memory cell of the memory array of FIG. 1 in accordance with one embodiment of the present disclosure.

FIG. 3 illustrates a portion of array 104 (FIG. 1) in further detail including memory cells 302, 304, 306, 308, 310, and 312 with discrete charge storage elements, also referred to as nanocrystals, 314 embedded in dielectric material under the control gates. A well or channel region 315 is configured in a substrate material below the dielectric material. Memory cell 302 has a control gate coupled to receive control gate voltage CG0, a select gate coupled to word line voltage WL00, a source terminal coupled to receive source voltage SRC0, and a drain terminal coupled to bit line voltage BL0. Memory cell 304 has a control gate coupled to receive control gate voltage CG0, a select gate coupled to word line voltage WL00, a source terminal coupled to receive SRC0, and a drain terminal coupled to bit line voltage BL1. Memory cell 306 has a control gate coupled to receive control gate voltage CG0, a select gate coupled to word line voltage WL01, a source terminal coupled to receive SRC0, and a drain terminal coupled to bit line voltage BL0. Memory cell 308 has a control gate coupled to receive control gate voltage CG0, a select gate coupled to word line voltage WL01, a source terminal coupled to receive SRC0, and a drain terminal coupled to bit line voltage BL1. Memory cell 310 has a control gate coupled to receive control gate voltage CG1, a select gate coupled to word line voltage WL10, a source terminal coupled to receive SRC1, and a drain terminal coupled to bit line voltage BL0. Memory cell 312 has a control gate coupled to receive control gate voltage CG10, a select gate coupled to word line voltage WL10, a source terminal coupled to receive SRC1, and a drain terminal coupled to bit line voltage BL1.

The control gate of each memory cell of sector 316 is coupled to receive control gate voltage CG0, the source terminal of each memory cell of sector 316 is coupled to receive source terminal voltage SRC0, the control gate of each memory cell of sector 318 is coupled to receive control gate voltage CG1, and the source terminal of each memory cell of sector 318 is coupled to receive source terminal voltage SRC1.

With reference to FIGS. 1 and 3, during a program operation, a particular memory cell of array 104 is selected for programming by an access address and data corresponding to an access request. Word line circuitry 102 activates a selected word line corresponding to the access address and source and control gate circuitry 106, 108 couples a current sink to the selected bit line corresponding to the access address, which causes the selected memory cell to be conductive. As an example of a program operation, memory cell 302 is selected for programming, and memory cells 304, 306, 308, 310, and 312 are unselected. In this case, sector 316 is selected since the selected word line is in sector 316, and all other sectors, including sector 318, are deselected. If memory cell 302 is selected, word line voltage WL00 is activated, and a current sink generated by source and control gate circuitry 106, 108 is coupled to the selected bit line, BL0.

When device 100 is unpowered, power is not available to word line circuitry 102, source circuitry 106, column/data circuitry 110, address control circuitry 112 and control gate logic and supply generation circuitry 114. Control gate driver circuitry 108 continues to supply the constant supply voltage VDD_C to all control gates of memory cells in array 104. The level of constant supply voltage VDD_C is sufficient to bias the control gates to reduce or prevent leakage of current stored in the storage elements.

FIG. 4 shows an example of different levels of voltage that may be used in the memory system of FIG. 1 during different modes. In Full Power (FP) Idle mode, control gate voltage is 1.5 Volts and word line voltage, bit line, and source voltages are 0 (zero). In standby mode, control gate voltage is VDD, while word line voltage is VSS (ground), bit line voltage is VSS, and source voltage is VSS. For power-off mode, control gate voltage is VDD_C and is applied to all of the control gates of memory cells in the memory array. The word line, bit line, and source voltages are VSS. In program mode, control gate voltage is 9 Volts, while word line voltage is 1 Volt, bit line voltage is proportional to bit line current ($I_{LD}$) to limit the maximum current through the selected cell during programming, and source voltage is 5 Volts. In erase mode, control gate voltage is 14 Volts, and word line voltage, bit line, and source voltages are 0 (zero). During read mode, control gate voltage is 1.5 Volts, word line voltage is 1.2 Volts, bit line voltage is 0.6 Volts, and source voltage is 0 (zero). Note that the values in FIG. 4 are provided as an example only and that other suitable values may be used in memory device 100.

By now it should be understood that in some embodiments there has been provided a non-volatile memory (NVM) system having a normal mode, a standby mode and an off mode that uses less power than the standby mode. An NVM array can comprise NVM cells and NVM peripheral circuitry, wherein each NVM cell includes a control gate. A controller (112, 114, 108) can be coupled to the NVM array that applies a voltage to the control gates and power to the peripheral circuitry during the standby mode and applies an off-mode voltage to the control gates and removes power from the NVM peripheral circuitry during the off mode.

In another aspect, the off-mode voltage can be less than an external power supply voltage.

In another aspect, the array comprises a plurality of sectors, wherein the control gates of NVM cells within each sector of the plurality of sectors are connected together, and during the normal mode, the voltage applied to the control gates may be different among the sectors.

In another aspect, during the off mode the off-mode voltage that is applied to the control gates can be the same for all of the sectors.

In another aspect, the NVM cells comprise split gate memory cells, wherein each of the split gate memory cells can have a charge storage layer between a channel region and the control gate.

In another aspect, the charge storage layer comprises nanocrystals.

In another aspect, the off-mode voltage can be a positive bias from the control gate to the channel region.

In another aspect, the off-mode voltage can be applied by applying a negative voltage relative to ground to the channel.

In another aspect, the off-mode voltage can be applied by applying a negative bias from the control gate to the channel region.

In another aspect, the array comprises a plurality of sectors, wherein the control gates of NVM cells within each sector of the plurality of sectors are connected together. The controller can comprise a supply voltage generator, coupled to an external power supply terminal, for providing voltage levels for the control gates for use in the normal mode. An off-mode supply circuit, coupled to the external power supply terminal, can supply the off-mode voltage. A plurality of control gate drivers can be coupled to the supply voltage generator and the power-down supply circuit. Each control gate driver can have a control gate output coupled to the control gates of one sector, each control gate output providing the off-mode voltage during the off mode.

In other embodiments, method of operating a non-volatile memory (NVM) in which the NVM comprises NVM peripheral circuitry and a plurality of NVM cells in which each NVM cell has a control gate. During a standby mode of the NVM, a voltage is applied to each control gate and applying power to the NVM peripheral circuitry. In response to entering an off mode of the NVM, a power-down bias voltage is applied to each control gate and removing power from the peripheral circuitry.

In another aspect, each NVM cell can have a source and a drain. Each source and drain are grounded during the off mode.

In another aspect, each NVM cell can have a channel and the applying the power-down bias voltage further characterized by grounding each channel during the off mode.

In another aspect, each NVM cell has a channel and the applying the power-down bias voltage can be further characterized by applying the off-mode voltage as a negative voltage to the channel and ground to the control gate.

In another aspect, each NVM cell can be further characterized as being a split gate NVM cell having a select gate, further comprising applying ground to each select gate during the off mode.

In another aspect, the control gates are connected sector lines and the applying the off-mode voltage can be further characterized as applying the off-mode voltage to the control gates by applying the off-mode voltage to the sector lines.

In other embodiments, a non-volatile memory (NVM) system can comprise an NVM array having a plurality of sectors in which each sector is independently addressable from the other sectors. Each sector has a plurality of NVM cells with control gates and channels. NVM peripheral circuitry accesses the NVM array. A control gate circuit provides control gate voltages to the control gates of the NVM cells of the plurality of sectors and applies power to the peripheral circuitry during a standby mode of the NVM system and applies an off-mode signal to the control gates and removes power from the peripheral circuitry during an off mode of the NVM system. Applying the power-down mode signal results in a positive voltage from the control gate to the channel for each NVM cell.

In another aspect, the NVM system can be further characterized by the NVM cells having voltage applied only to the control gates during the off mode.

In another aspect, the NVM system can be further characterized as having a normal mode that comprises erase, read, and program.

In another aspect, the NVM peripheral circuitry can comprise word line drivers and column/data circuitry.

The semiconductor substrate described herein can be any semiconductor material or combinations of materials, such as gallium arsenide, silicon germanium, silicon-on-insulator (SOI), silicon, monocrystalline silicon, silicided silicon, pure metal nanodots, or eutectic metal nanodots, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed. For example, the control gate bias voltage, also referred to herein as constant supply voltage VDD_C, may have positive or negative polarity, with components such as N and P-channel transistors and supply voltages in memory device 100 being selected to accommodate the desired polarity. Additionally, instead of applying the constant supply voltage VDD_C to the control gate of the memory cells, an opposite polarity voltage may be applied to the channel of the memory cells with ground or VSS applied at the control gate.

Although the invention is described herein with reference to specific embodiments, various modifications and changes can be made without departing from the scope of the present invention as set forth in the claims below. For example, control gate bias may be used with other types of memory cells other than split gate thin film storage memory cells. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile memory (NVM) system having a normal mode, a standby mode and an off mode that uses less power than the standby mode, comprising:
    an NVM array comprising NVM cells and NVM peripheral circuitry, wherein each NVM cell includes a control gate and the NVM peripheral circuitry includes column/data circuitry and word line circuitry;
    control gate driver circuitry coupled to the control gate of each NVM cell;
    a controller coupled to the NVM array, that applies a voltage to the control gates through the control gate circuitry and power to the peripheral circuitry during the standby mode and applies an off-mode voltage that is less than an external power supply voltage to the control gates through the control gate driver circuitry and removes power from the NVM peripheral circuitry during the off mode.

2. The NVM system of claim 1, wherein the array comprises a plurality of sectors, wherein the control gates of NVM cells within each sector of the plurality of sectors are connected together, and during the normal mode, the voltage applied to the control gates may be different among the sectors.

3. The NVM system of claim 2, wherein during the off mode the off-mode voltage that is applied to the control gates is the same for all of the sectors.

4. The NVM system of claim 1, wherein the NVM cells comprise split gate memory cells, wherein each of the split gate memory cells has a charge storage layer between a channel region and the control gate.

5. The NVM system of claim 4, wherein the charge storage layer comprises nanocrystals.

6. The NVM system of claim 5, wherein the off-mode voltage is a positive bias from the control gate to the channel region.

7. The NVM system of claim 6, wherein the off-mode voltage is applied by applying a negative voltage relative to ground to the channel.

8. The NVM system of claim 5, wherein the off-mode voltage is applied by applying a negative bias from the control gate to the channel region.

9. The NVM system of claim 1, wherein:
    the array comprises a plurality of sectors, wherein the control gates of NVM cells within each sector of the plurality of sectors are connected together; and
    the controller comprises:
        a supply voltage generator, coupled to an external power supply terminal, for providing voltage levels for the control gates for use in the normal mode;
        an off-mode supply circuit, coupled to the external power supply terminal, that supplies the off-mode voltage, and
        a plurality of control gate drivers coupled to the supply voltage generator and a power-down supply circuit, wherein each control gate driver has a control gate output coupled to the control gates of one sector, each control gate output providing the off-mode voltage during the off mode.

10. A method of operating a non-volatile memory (NVM) in which the NVM comprises NVM peripheral circuitry that includes column/data circuitry and word line circuitry and a plurality of NVM cells in which each NVM cell has a control gate, comprising:
    during a standby mode of the NVM, applying a voltage to each control gate and applying power to the NVM peripheral circuitry; and
    in response to entering an off mode of the NVM, applying a power-down bias voltage to each control gate through control gate circuitry and removing power from the peripheral circuitry.

11. The method of claim 10, wherein each NVM cell has a source and a drain, further comprising grounding each source and drain during the off mode.

12. The method of claim 11, wherein each NVM cell has a channel and the applying the power-down bias voltage further characterized by grounding each channel during the off mode.

13. The method of claim 11, wherein each NVM cell has a channel and the applying the power-down bias voltage is further characterized by applying the off-mode voltage as a negative voltage to the channel and ground to the control gate.

14. The method of claim 10, wherein each NVM cell is further characterized as being a split gate NVM cell having a select gate, further comprising applying ground to each select gate during the off mode.

15. The method of claim 10, wherein the control gates are connected sector lines and the applying the off-mode voltage is further characterized as applying the off-mode voltage to the control gates by applying the off-mode voltage to the sector lines.

16. A non-volatile memory (NVM) system, comprising:
    an NVM array having a plurality of sectors in which each sector is independently addressable from the other sectors, wherein each sector has a plurality of NVM cells with control gates and channels;
    NVM peripheral circuitry for accessing the NVM array; and
    a control gate circuit that provides control gate voltages to the control gates of the NVM cells of the plurality of sectors and applies power to the peripheral circuitry during a standby mode of the NVM system and applies an off-mode signal to the control gates and removes power from the peripheral circuitry during an off mode of the NVM system, wherein the applying the power-down mode signal results in a positive voltage from the control gate to the channel for each NVM cell.

17. The NVM system of claim 16, wherein the NVM system is further characterized by the NVM cells having voltage applied only to the control gates during the off mode.

18. The NVM system of claim 16, wherein the NVM system is further characterized as having a normal mode that comprises erase, read, and program.

19. The NVM system of claim 16, wherein the NVM peripheral circuitry comprises word line drivers and column/data circuitry.

\* \* \* \* \*